US012666535B2

(12) United States Patent
Woodham, Jr. et al.

(10) Patent No.: US 12,666,535 B2
(45) Date of Patent: Jun. 23, 2026

(54) USER INTERFACE ASSEMBLY INCLUDING INDIVIDUALLY ILLUMINATED ICONS FOR AN APPLIANCE

(71) Applicant: Haier US Appliance Solutions, Inc., Wilmington, DE (US)

(72) Inventors: Richard Gary Woodham, Jr., Taylorsville, KY (US); Donald James Leisl, III, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 141 days.

(21) Appl. No.: 18/733,433

(22) Filed: Jun. 4, 2024

(65) Prior Publication Data

US 2025/0374434 A1     Dec. 4, 2025

(51) Int. Cl.
| | |
|---|---|
| *H05K 1/18* | (2026.01) |
| *H05K 1/181* | (2026.01) |
| *H05K 5/00* | (2006.01) |

(52) U.S. Cl.
CPC .......... *H05K 1/181* (2013.01); *H05K 5/0018* (2022.08); *H05K 2201/10106* (2013.01)

(58) Field of Classification Search
CPC ........ H05K 1/18; H05K 1/181; H05K 5/0018; H05K 2201/10106; D06F 34/08

USPC .......................................................... 361/760
See application file for complete search history.

(56) References Cited

U.S. PATENT DOCUMENTS

| | | | |
|---|---|---|---|
| 6,664,489 | B2 | 12/2003 | Kleinhans et al. |
| 9,940,857 | B2 | 4/2018 | Heater et al. |
| 10,416,372 | B2 | 9/2019 | Doering et al. |
| 2007/0095643 | A1 | 5/2007 | Weiss et al. |
| 2016/0071443 | A1 | 3/2016 | Heater et al. |

FOREIGN PATENT DOCUMENTS

CN          218676011 U     3/2023

*Primary Examiner* — Tremesha W Burns
(74) *Attorney, Agent, or Firm* — Dority & Manning, P.A.

(57) ABSTRACT

A user interface assembly for a domestic appliance includes a circuit board including at least one touch sensor and at least one light source; a control panel spaced apart from the circuit board along a longitudinal direction; at least one conductive foam filler provided between the circuit board and the control panel, the at least one conductive foam filler including an aperture defined therethrough along the longitudinal direction; and a light guide plate provided between the conductive foam filler and the control panel, the light guide plate including a stem portion extending along the longitudinal direction and a diffusion portion positioned at a first end of the stem portion.

20 Claims, 3 Drawing Sheets

USER INTERFACE ASSEMBLY INCLUDING INDIVIDUALLY ILLUMINATED ICONS FOR AN APPLIANCE

FIELD OF THE INVENTION

The present subject matter relates generally to domestic appliances, and more particularly to user interface assemblies for domestic appliances.

BACKGROUND OF THE INVENTION

Certain domestic appliances may include a variety of controls configured to receive inputs for performing certain operations within the appliance. According to one example, a laundry treatment appliance such as a washing machine appliance may include a touch interface including a variety of touch inputs. For instance, capacitive touch sensing types of controls that rely on sensitivity to a user's touch may be included on a fascia of the appliance. These controls may be provided as part of a user interface assembly for controlling various operations of the appliance.

Such user interface assemblies may use a variety of lighted features, such as, text, digits, and/or symbols, to display information to a user regarding the appliance on the surface of the appliance. For example, a front surface or an upper surface of the appliance may include a user interface area, including a display area, where information may be displayed to the user using lighted symbols. Additionally, the controls may be illuminated at positions where the user may provide a touch input to control the appliance. This may be accomplished with a radially or linearly illuminated bar graph type display with increasing illuminated length indicative of the heating level selected. Some current displays have discrete light segments with dark areas between the segments. For design considerations, other displays have a reduced segmentation appearance but have an indistinct end point due to light bleed.

Accordingly, a user interface assembly for a domestic appliance would be beneficial. In particular, a user interface assembly with individual illumination points would be useful.

BRIEF DESCRIPTION OF THE INVENTION

Aspects and advantages of the invention will be set forth in part in the following description, or may be obvious from the description, or may be learned through practice of the invention.

In one exemplary aspect of the present disclosure, a user interface assembly for a domestic appliance is provided. The user interface assembly may include a circuit board including a top board face and a bottom board face, the circuit board including at least one touch sensor and at least one light source; a control panel spaced apart from the circuit board along a longitudinal direction, the control panel including a top panel face and a bottom panel face, wherein the bottom panel face faces the top board face; at least one conductive foam filler provided between the circuit board and the control panel, the at least one conductive foam filler including an aperture defined therethrough along the longitudinal direction; and a light guide plate provided between the conductive foam filler and the control panel, the light guide plate including a stem portion extending along the longitudinal direction and a diffusion portion positioned at a first end of the stem portion.

In another exemplary aspect of the present disclosure, a domestic appliance is provided. The domestic appliance may include a cabinet forming a receiving space; and a user interface assembly provided on the cabinet. The user interface assembly may include a circuit board including a top board face and a bottom board face, the circuit board including at least one touch sensor and at least one light source; a control panel spaced apart from the circuit board along a longitudinal direction, the control panel including a top panel face and a bottom panel face, wherein the bottom panel face faces the top board face; at least one conductive foam filler provided between the circuit board and the control panel, the at least one conductive foam filler including an aperture defined therethrough along the longitudinal direction; and a light guide plate provided between the conductive foam filler and the control panel, the light guide plate including a stem portion extending along the longitudinal direction and a diffusion portion positioned at a first end of the stem portion.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

Figure 1:
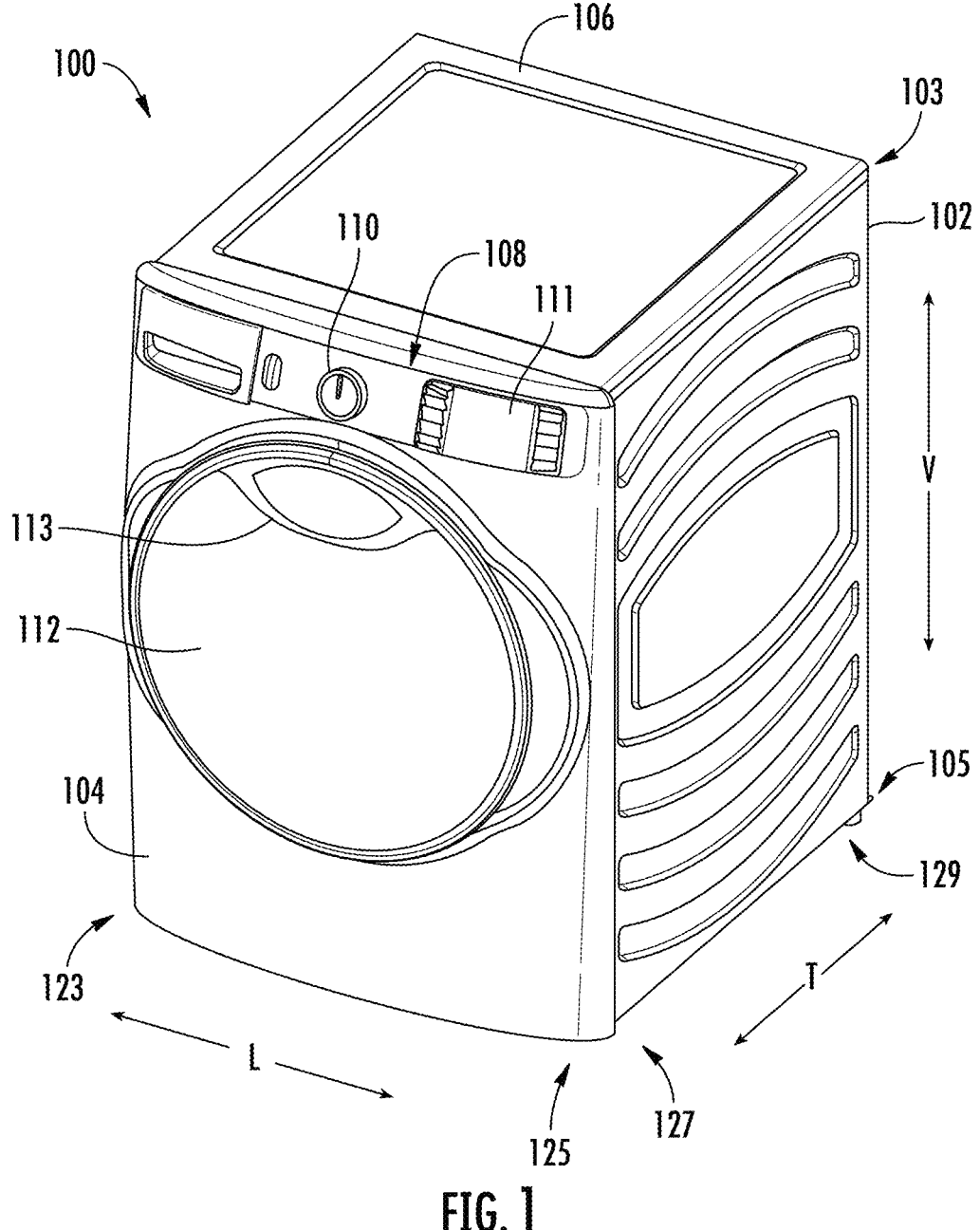
FIG. 1 provides a front perspective view of a laundry treatment appliance according to exemplary embodiments of the present disclosure.

Repeat use of reference characters in the present specification and drawings is intended to represent the same or analogous features or elements of the present invention.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first," "second," and "third" may be used interchangeably to distinguish one component from another and are not intended to signify location or importance of the individual components. The terms "includes" and "including" are intended to be inclusive in a manner similar to the term "comprising." Similarly, the term "or" is generally intended to be inclusive (i.e., "A or B" is intended to mean "A or B or both"). In addition, here and throughout the specification and claims, range limitations may be combined and/or interchanged. Such ranges are identified and include all the sub-ranges contained therein unless context or language indicates otherwise. For example, all ranges disclosed herein are inclusive of the endpoints, and the endpoints are independently combinable with each other. The singular forms "a," "an," and "the" include plural references unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "generally," "about," "approximately," and "substantially," are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin, i.e., including values within ten percent greater or less than the stated value. In this regard, for example, when used in the context of an angle or direction, such terms include within ten degrees greater or less than the stated angle or direction, e.g., "generally vertical" includes forming an angle of up to ten degrees in any direction, e.g., clockwise or counterclockwise, with the vertical direction V.

The word "exemplary" is used herein to mean "serving as an example, instance, or illustration." In addition, references to "an embodiment" or "one embodiment" does not necessarily refer to the same embodiment, although it may. Any implementation described herein as "exemplary" or "an embodiment" is not necessarily to be construed as preferred or advantageous over other implementations. Moreover, each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents.

Figure 2:
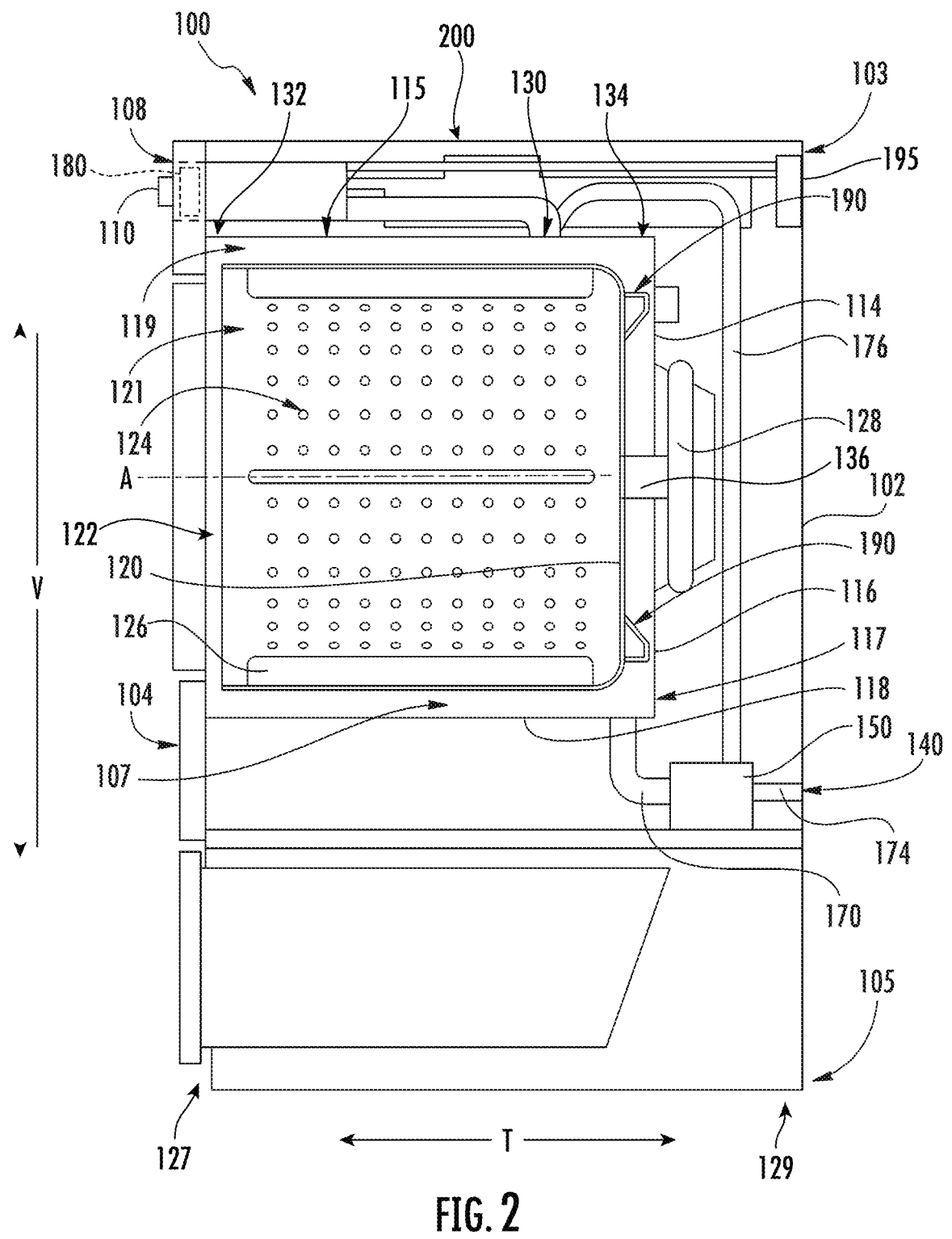
FIG. 2 provides a side schematic view of the exemplary laundry treatment appliance of FIG. 1.

FIGS. 1 and 2 provide various views of an exemplary horizontal axis laundry treatment appliance 100 according to one exemplary embodiment of the present disclosure. For instance, laundry treatment appliance 100 may perform each of a wash cycle or operation and a drying cycle or operation. In particular, FIG. 1 provides a front, perspective view of horizontal axis laundry treatment appliance 100 and FIG. 2 provides a side, section view of laundry treatment appliance 100. As shown in FIG. 1, laundry treatment appliance 100 includes a cabinet 102 that extends between a top 103 and a bottom 105, e.g., along a vertical direction V. Cabinet 102 also extends between a first side 123 and a second side 125, e.g., along a lateral direction L, and between a front 127 and a rear 129, e.g., along a transverse direction T. The vertical, lateral, and transverse directions V, L, T defined by laundry treatment appliance 100 are mutually perpendicular and together define an orthogonal direction system.

Cabinet 102 includes a front panel 104. A door 112 is mounted to front panel 104 and is rotatable between an open position (not shown) facilitating access to a wash drum or basket 120 (FIG. 2) located within cabinet 102, and a closed position (shown in FIGS. 1 and 2) hindering access to basket 120. A user may pull on a handle 113 in order to selectively adjust door 112 between the open and closed positions. Cabinet 102 also includes a top panel 106 positioned at top 103 of cabinet 102.

A control panel 108 including a plurality of input selectors 110 is coupled to front panel 104. Control panel 108 and input selectors 110 collectively form a user interface input for operator selection of machine cycles and features. For example, in some embodiments, control panel 108 includes a display 111 (FIG. 1) configured to present or indicate selected features, a countdown timer, and/or other items of interest to machine users.

As shown in FIG. 2, a tub 114 defines a wash fluid compartment 119 configured for receipt of a washing fluid. Thus, tub 114 is configured for containing washing fluid, e.g., during operation of laundry treatment appliance 100 (e.g., a wash cycle or operation). Washing fluid disposed within tub 114 may include, for example, at least one of water, fabric softener, bleach, and detergent. Tub 114 includes a back wall 116 and a sidewall 118 and extends between a top 115 and a bottom 117, e.g., along the vertical direction V. Further, tub 114 extends between a front 132 and a rear 134, e.g., along the transverse direction T.

Basket 120 is rotatably mounted within tub 114 in a spaced apart relationship from tub sidewall 118 and tub back wall 116. One or more bearing assemblies may be placed between basket 120 and tub 114 and may allow for rotational movement of basket 120 relative to tub 114. Basket 120 defines a wash chamber 121 and an opening 122. Opening 122 of basket 120 permits access to wash chamber 121 of basket 120, e.g., in order to load articles into basket 120 and remove articles from basket 120. Basket 120 also defines a plurality of perforations 124 to facilitate fluid communication between an interior of basket 120 and tub 114. A sump 107 is defined by tub 114 and is configured for receipt of washing fluid during operation of appliance 100. For example, during operation of appliance 100 (e.g., the wash cycle), washing fluid may be urged by gravity from basket 120 to sump 107 through plurality of perforations 124.

A spout 130 is configured for directing a flow of fluid into tub 114. Spout 130 may be in fluid communication with a water supply (not shown) in order to direct fluid (e.g., clean water) into tub 114. A pump assembly 150 (shown schematically in FIG. 2) is located beneath tub 114 for draining tub 114 of fluid. Pump assembly 150 is in fluid communication with sump 107 of tub 114 via a conduit 170. Thus, conduit 170 directs fluid from tub 114 to pump assembly 150. Pump assembly 150 is also in fluid communication with a drain 140 via piping 174. Pump assembly 150 can urge fluid disposed in sump 107 to drain 140 during operation of appliance 100 in order to remove fluid from tub 114. Fluid received by drain 140 from pump assembly 150 is directed out of appliance 100, e.g., to a sewer or septic system.

In addition, pump assembly 150 is configured for recirculating washing fluid within tub 114. Thus, pump assembly 150 is configured for urging fluid from sump 107, e.g., to spout 130. For example, pump assembly 150 may urge washing fluid in sump 107 to spout 130 via hose 176 during operation of appliance 100 in order to assist in cleaning articles disposed in basket 120. It should be understood that conduit 170, piping 174, and hose 176 may be constructed of any suitable mechanism for directing fluid, e.g., a pipe, duct, conduit, hose, or tube, and are not limited to any particular type of mechanism.

A motor 128 is in mechanical communication with basket 120 in order to selectively rotate basket 120, e.g., during an agitation or a rinse cycle of laundry treatment appliance 100 as described below. In particular, a shaft 136 mechanically couples motor 128 with basket 120 and drivingly rotates basket 120 about a shaft or central axis A, e.g., during a spin cycle. Ribs 126 extend from basket 120 into wash chamber 121. Ribs 126 assist agitation of articles disposed within wash chamber 121 during operation of laundry treatment appliance 100. For example, ribs 126 may lift articles disposed in basket 120 during rotation of basket 120.

Also shown in FIG. 2 is a balancing apparatus 190. Balancing apparatus 190 can include a balancing ring, for example. The balancing ring can have an annular cavity in which a balancing material is free to rotate and move about. For example, the balancing material can be a fluid such as water or can be balancing balls. The balancing ring can include one or more interior baffles. Although a single balancing ring or apparatus 190 is shown in FIG. 2, any number of such rings or apparatuses can be included in laundry treatment appliance 100 and can be placed according to any known or desirable configuration. For example, two balancing rings may be respectively placed at the front and back of basket 120.

As further shown in FIG. 2, laundry treatment appliance 100 includes a dispenser assembly 200. Dispenser assembly 200 includes features for receiving various wash treatment additives (e.g., fluid detergent, powder detergent, fabric softener, bleach, powder or any other suitable liquid) and dispensing or directing them to wash fluid compartment 119 of tub 114 during operation of laundry treatment appliance 100. Dispenser assembly 200 will be described in further detail below. In detail, one or more of the additives may be added during either or both of a wash cycle and a drying cycle.

Operation of laundry treatment appliance 100 may be controlled by a processing device or controller 180 that is operatively coupled to control panel 108 for user manipulation to select washing and/or drying cycles and features. In response to user manipulation of control panel 108, controller 180 may operate the various components of laundry treatment appliance 100 to execute selected machine cycles and features.

Controller 180 may include a memory and microprocessor, such as a general or special purpose microprocessor operable to execute programming instructions or microcontrol code associated with a cleaning cycle. The memory may represent random access memory such as DRAM, or read only memory such as ROM or FLASH. In one embodiment, the processor executes programming instructions stored in memory. The memory may be a separate component from the processor or may be included onboard within the processor. Alternatively, controller 180 may be constructed without using a microprocessor, e.g., using a combination of discrete analog and/or digital logic circuitry (such as switches, amplifiers, integrators, comparators, flipflops, AND gates, and the like) to perform control functionality instead of relying upon software. Control panel 108 and other components of laundry treatment appliance 100 may be in communication with controller 180 via one or more signal lines or shared communication busses.

While described in the context of a specific embodiment of horizontal axis laundry treatment appliance 100, it will be understood that horizontal axis laundry treatment appliance 100 is provided by way of example only. Other laundry treatment appliances having different configurations, different appearances, and/or different features may also be utilized with the present subject matter as well, including, for example, vertical axis laundry treatment appliances. Additionally or alternatively, it should be noted that the features described herein may be incorporated into any suitable domestic appliance, including but not limited to refrigerator appliances, cooking or oven appliances, microwave appliances, air conditioner appliances, dishwasher appliances, and the like. Thus, the teachings of the present disclosure are not limited to use with laundry treatment appliance 100.

Figure 3:
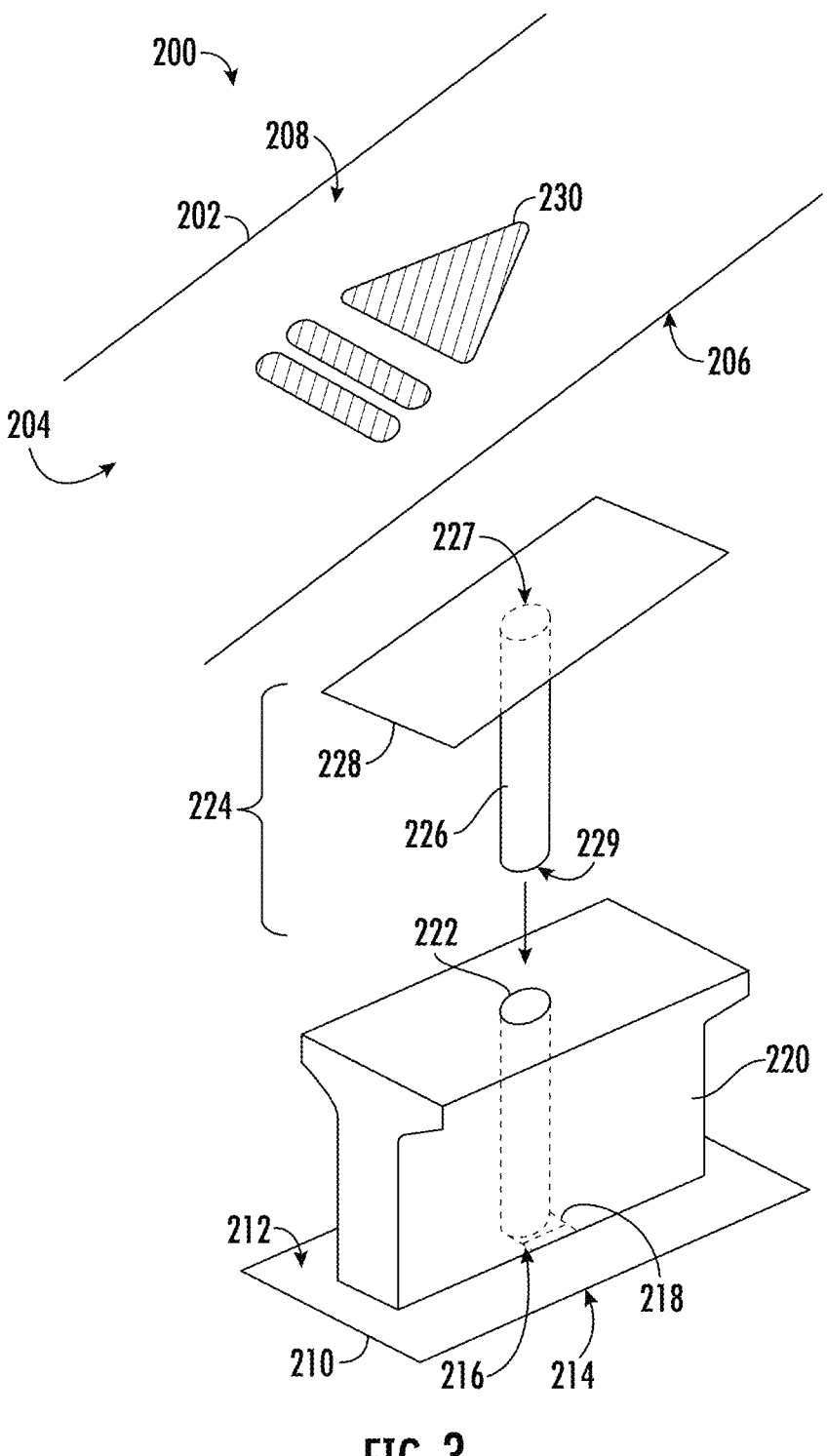
FIG. 3 provides an exploded perspective view of a user interface assembly of a domestic appliance according to exemplary embodiments of the present disclosure.

FIG. 3 provides an exploded perspective view of an exemplary user interface assembly 200 according to exemplary embodiments. For instance, user interface assembly 200 may be incorporated into laundry treatment appliance 100. Additionally or alternatively, user interface assembly 200 may be incorporated into any suitable domestic appliance as described above. Accordingly, user interface assembly 200 may be configured to receive inputs (e.g., touch inputs) and transmit signals to a controller (e.g., controller 180) to perform a variety of operations within the associated appliance. For the purposes of this disclosure, user interface assembly 200 is described with reference to laundry treatment appliance 100.

User interface assembly 200 may include a control panel 202. According to some embodiments, control panel 202 is equivalent to control panel 108. Control panel 202 may include a top panel face 204 and a bottom panel face 206 opposite a top panel face 204. For instance, according to at least one embodiment, top panel face 204 faces upward (e.g., along the vertical direction V). However, it should be noted that user interface assembly 200 may be oriented in any suitable direction and the disclosure is not limited to the examples provided herein. Accordingly, hereinafter, top panel face 204 may be referred to as facing a longitudinal direction. Additionally or alternatively, control panel 202 may extend within a latitudinal plane, the latitudinal plane being perpendicular with the longitudinal direction. Accordingly, a plurality of latitudinal planes may be defines within user interface assembly 200. Top panel face 204 may form a contact portion of control panel 202. For instance, top panel face 204 may be configured to receive inputs (e.g., user inputs) to operate the appliance.

User interface assembly 200 may include one or more touch buttons 208 that are positioned along control panel 202 and are operable to detect user inputs on control panel 202. For instance, touch buttons 208 may be configured for triggering when a user touches top panel face 204 of control panel 202. In particular, touch buttons 208 may include capacitive sensors capable of detecting when a finger or another conductive material with a dielectric difference from air contacts or approaches control panel 202. Thus, when a user touches top panel face 204 of control panel 202 adjacent one of touch buttons 208, a sensor (described below) may trigger and, e.g., signal a controller (e.g., controller 180). In such a manner, operations of the appliance may be initiated and controlled. The sensors may be distributed across control panel 202. It should be understood that other any suitable number, type, and position of touch buttons 208 may be incorporated while remaining within the scope of the present subject matter. Furthermore, top panel face 204 of control panel 202 may have any suitable shape or configuration. For example, in an embodiment, control panel 202 may be arcuate (e.g., curved). In alternative embodiments, control panel 202 may be flat.

User interface assembly 200 may include a circuit board 210. For instance, circuit board 210 may be a printed circuit board (PCB). Circuit board 210 may be operably (e.g., electrically) connected with control panel 202. Accordingly, inputs to control panel 202 (e.g., at touch buttons 208) may be received at circuit board 210. Circuit board 210 may include a top board face 212 and a bottom board face 214. Circuit board 210 may be spaced apart from control panel 202 along the longitudinal direction. For instance, top board face 212 may face bottom panel face 206 (e.g., along the longitudinal direction).

According to some embodiments, circuit board 210 includes a touch sensor 216. For instance, touch sensor 216 may be configured to receive or detect a touch input (e.g., to touch button 208). A plurality of distinct touch sensors 216 may be provided along circuit board 210 (e.g., along top board face 212). For instance, each of the plurality of touch sensors 216 may be spaced apart from each other along circuit board 210. Touch sensor 216 may be conductive sensors, such that, as explained above, when a conductive material contacts or approaches touch sensor 216, a trigger may be sent to controller 180.

Circuit board 210 may include a light source 218. For instance, light source 218 may be a light emitting diode (LED). According to some embodiments, a plurality of light sources 218 may be provided. The plurality of light sources 218 may be spaced apart along circuit board 210 (e.g., along top board face 212). Additionally or alternatively, light source 218 may be positioned within touch sensor 216. For instance, touch sensor 216 and light source 218 may be stacked or overlapped along the longitudinal direction. In additional or alternative embodiments, light source 218 may be positioned adjacent to touch sensor 216. Light source 218 may be configured to illuminate according to one of a plurality of input signals. For one example, a single light source 218 may be associated with a touch sensor 216 dedicated to a start signal for initiating an operation (e.g., a laundry operation) within appliance 100. Thus, when certain selections are made on control panel 202, the single light source 218 may be illuminated to indicate to a user that the operation may be initiated via a touch input. As will be explained, the illumination may be confined to an associated touch button 208 on control panel 202.

User interface assembly 200 may include a conductive foam filler 220. Conductive foam filler 220 may be positioned between control panel 202 and circuit board 210 (e.g., along the longitudinal direction). For instance, conductive foam filler 220 may provide a contact between top board face 212 and bottom panel face 206. Accordingly, conductive foam filler 220 may provide a conductive connection between control panel 202 and circuit board 210. Thus, as explained above, touch inputs received at control panel 202 (e.g., at touch button 208) may be transmitted to circuit board 210 (e.g., at touch sensor 216). Conductive foam filler 220 may include a pliable, moldable, or otherwise elastic material. Accordingly, a top portion of conductive foam filler 220 may be shaped to fit or abut bottom panel face 206 of control panel 202 (i.e., in a situation where control panel 202 is arcuate or curved).

In some instances, a plurality of conductive foam fillers 220 may be included. For instance, a unique or individual conductive foam filler 220 for each touch button 208 may be included. Each unique conductive foam filler 220 may be independently provided and spaced apart from adjacent conductive foam fillers 220. Thus, as will be mentioned below, light bleed between distinct touch buttons 208 may be avoided by containing the light to a dedicated touch button associated with a single conductive foam filler 220, a single light source 218, and a single touch sensor 216. Hereinafter, a single conductive foam filler 220 will be described with the understanding that the explanation applies to any suitable number of conductive foam fillers 220 applied in specific embodiments.

Conductive foam filler 220 may include an aperture 222 formed therein. Aperture 222 may defined along the longitudinal direction (e.g., from control panel 202 to circuit board 210). Aperture 222 may be aligned with each of light source 218 and touch button 208. Accordingly, light produced at light source 218 may be directed toward touch button 208 via aperture 222. Aperture 222 may define any suitable cross section (e.g., along a latitudinal plane) such that light from light source 218 travels therethrough.

User interface assembly 200 may include a light guide plate 224. At least a portion of light guide plate 224 may be provided between conductive foam filler 220 and control panel 202. For instance, light guide plate 224 may include a stem portion 226 and a diffusion portion 228. Stem portion 226 may extend along the longitudinal direction and define a first end 227 and a second end 229 opposite first end 227. For instance, stem portion 226 may be received or accommodated within aperture 222 of conductive foam filler 220. An extending length of stem portion 226 may be approximately equal to a height of conductive foam filler 220 along the longitudinal direction. Additionally or alternatively, stem portion 226 may define a cross section commensurate with the cross section of aperture 222. Thus, light from light source 218 may enter stem portion 226 (e.g., at second end 229 thereof) of light guide plate 224 and travel toward control panel 202.

Diffusion portion 228 of light guide plate 224 may be positioned at first end 227 of stem portion 226. For instance, diffusion portion 228 may be positioned adjacent control panel 202 (e.g., adjacent to bottom panel face 206). Diffusion portion 228 may extend within a latitudinal plane defined between control panel 202 and the top of conductive foam filler 220. Diffusion portion 228 may be configured to diffuse light from light source 218 (e.g., along the latitudinal plane). As would be understood, a plurality of light guide plates 224 may be included, such as a first light guide plate, a second light guide plate, etc. Accordingly, the first light guide plate may include a first stem portion and a first diffusion portion, the second light guide plate may include a second stem portion and a second diffusion portion, and so on.

Control panel 202 may include a translucent portion 230. In detail, translucent portion 230 may correspond with touch button 208 such that translucent portion identifies and defines touch button 208. Thus, translucent portion 230 may define an indicator. Translucent portion 230 may have or define a unique shape. For instance, as shown in FIG. 3, translucent portion 230 may have or include a triangle shape to indicate a start icon. Although a single example is provided herein, it should be understood that a plurality of translucent portions 230 may be provided in any suitable shapes or sizes, including icons, letters, numbers, words, or the like.

Light from light source 218 may selectively shine through translucent portion 230. For instance, when touch button 208 is activated (e.g., via controller 180), light source 218 may be illuminated to shine through translucent portion 230, thus indicating that the corresponding touch button 208 is able to receive inputs.

According to some embodiments, a surface area of diffusion portion 228 of light guide plate 224 may correspond to translucent portion 230. For instance, diffusion portion 228 may have a size corresponding to a maximum coverage area of translucent portion 230. Referring again to the example provided above, when translucent portion 230 is a triangle shape, the surface area of diffusion portion 228 may be such that each extreme point of translucent portion is overlapped by diffusion portion 228. Advantageously, light produced at light source 218 is restricted by the bounds of diffusion portion 228 such that only the corresponding translucent portion 230 of the desired touch button 208 is illuminated, thus restricting light bleed to adjacent translucent portions or icons.

As mentioned above, a plurality of touch buttons 208 may be provided. Accordingly, a plurality of touch sensors 216, a plurality of light sources 218, a plurality of conductive foam fillers 220, and a plurality of light guide plates 224 may be provided. As would be understood, each independent touch button would include a single dedicated combination of touch sensor 216, light source 218, conductive foam filler 220, and light guide plate 224.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A user interface assembly for a domestic appliance, the user interface assembly comprising:
   a circuit board comprising a top board face and a bottom board face, the circuit board comprising at least one touch sensor and at least one light source;
   a control panel spaced apart from the circuit board along a longitudinal direction, the control panel comprising a top panel face and a bottom panel face, wherein the bottom panel face faces the top board face;
   at least one conductive foam filler provided between the circuit board and the control panel, the at least one conductive foam filler comprising an aperture defined therethrough along the longitudinal direction; and
   a light guide plate provided between the conductive foam filler and the control panel, the light guide plate comprising a stem portion extending along the longitudinal direction and a diffusion portion positioned at a first end of the stem portion.

2. The user interface assembly of claim 1, wherein the stem portion of the light guide plate is accommodated within the aperture of the conductive foam filler.

3. The user interface assembly of claim 1, wherein a second end of the stem portion is positioned adjacent to the at least one light source.

4. The user interface assembly of claim 1, wherein the diffusion portion of the light guide plate extends along a latitudinal plane, the latitudinal plane being perpendicular with the longitudinal direction.

5. The user interface assembly of claim 4, wherein the control panel further comprises:
   at least one translucent portion defining an indicator, the at least one translucent portion having a unique shape.

6. The user interface assembly of claim 5, wherein a surface area of the light guide plate along the latitudinal plane corresponds to the at least one translucent portion of the control panel.

7. The user interface assembly of claim 1, wherein the at least one light source comprises a light emitting diode (LED).

8. The user interface assembly of claim 1, wherein the at least one conductive foam filler comprises a plurality of conductive foam fillers spaced apart along the top board face.

9. The user interface assembly of claim 8, wherein the light guide plate is a first light guide plate, the stem portion is a first stem portion, and the diffusion portion is a first diffusion portion and wherein the user interface assembly further comprises:
   a second light guide plate comprising a second stem portion and a second diffusion portion, the second diffusion portion being spaced apart from the first diffusion portion within a latitudinal plane, the latitudinal plane being perpendicular with the longitudinal direction.

10. The user interface assembly of claim 9, wherein the first light guide plate is attached to a first conductive foam filler of the plurality of conductive foam fillers and the second light guide plate is attached to a second conductive foam filler of the plurality of conductive foam fillers.

11. A domestic appliance comprising:
   a cabinet forming a receiving space; and
   a user interface assembly provided on the cabinet, the user interface assembly comprising:
      a circuit board comprising a top board face and a bottom board face, the circuit board comprising at least one touch sensor and at least one light source;
      a control panel spaced apart from the circuit board along a longitudinal direction, the control panel comprising a top panel face and a bottom panel face, wherein the bottom panel face faces the top board face;
      at least one conductive foam filler provided between the circuit board and the control panel, the at least one conductive foam filler comprising an aperture defined therethrough along the longitudinal direction; and
      a light guide plate provided between the conductive foam filler and the control panel, the light guide plate comprising a stem portion extending along the longitudinal direction and a diffusion portion positioned at a first end of the stem portion.

12. The domestic appliance of claim 11, wherein the stem portion of the light guide plate is accommodated within the aperture of the conductive foam filler.

13. The domestic appliance of claim 11, wherein a second end of the stem portion is positioned adjacent to the at least one light source.

14. The domestic appliance of claim 11, wherein the diffusion portion of the light guide plate extends along a latitudinal plane, the latitudinal plane being perpendicular with the longitudinal direction.

15. The domestic appliance of claim 14, wherein the control panel further comprises:
   at least one translucent portion defining an indicator, the at least one translucent portion having a unique shape.

16. The domestic appliance of claim 15, wherein a surface area of the light guide plate along the latitudinal plane corresponds to the at least one translucent portion of the control panel.

17. The domestic appliance of claim 11, wherein the at least one light source comprises a light emitting diode (LED).

18. The domestic appliance of claim 11, wherein the at least one conductive foam filler comprises a plurality of conductive foam fillers spaced apart along the top board face.

19. The domestic appliance of claim 18, wherein the light guide plate is a first light guide plate, the stem portion is a first stem portion, and the diffusion portion is a first diffusion portion and wherein the user interface assembly further comprises:

a second light guide plate comprising a second stem portion and a second diffusion portion, the second diffusion portion being spaced apart from the first diffusion portion within a latitudinal plane, the latitudinal plane being perpendicular with the longitudinal direction.

20. The domestic appliance of claim 19, wherein the first light guide plate is attached to a first conductive foam filler of the plurality of conductive foam fillers and the second light guide plate is attached to a second conductive foam filler of the plurality of conductive foam fillers.

* * * * *